United States Patent
Tanimoto et al.

(10) Patent No.: US 7,408,760 B2
(45) Date of Patent: Aug. 5, 2008

(54) CHARGED PARTICLE BEAM APPLICATION SYSTEM

(75) Inventors: Sayaka Tanimoto, Kodaira (JP); Yasunari Soda, Kawasaki (JP); Masakazu Sugaya, Inagi (JP); Hiroshi Tooyama, Hachioji (JP); Takeshi Tsutsumi, Hitachinaka (JP); Yasuhiro Someda, Tochigi (JP)

(73) Assignees: Hitachi High-Technologies Corporation, Tokyo (JP); Canon Kabushiki Kaisha, Tokyo (JP)

( * ) Notice: Subject to any disclaimer, the term of this patent is extended or adjusted under 35 U.S.C. 154(b) by 511 days.

(21) Appl. No.: 11/221,815

(22) Filed: Sep. 9, 2005

(65) Prior Publication Data

US 2006/0056131 A1 Mar. 16, 2006

(30) Foreign Application Priority Data

Sep. 10, 2004 (JP) ............................ 2004-263191
Aug. 25, 2005 (JP) ............................ 2005-243544

(51) Int. Cl.
*H01L 21/683* (2006.01)
(52) U.S. Cl. ....................................... 361/234
(58) Field of Classification Search .................. 361/234
See application file for complete search history.

(56) References Cited

U.S. PATENT DOCUMENTS

| | | | | |
|---|---|---|---|---|
| 5,148,036 A | * | 9/1992 | Matsugu et al. | 250/548 |
| 5,179,498 A | * | 1/1993 | Hongoh et al. | 361/234 |
| 5,225,892 A | * | 7/1993 | Matsugu et al. | 356/401 |
| 6,716,301 B2 | * | 4/2004 | Kanno et al. | 156/345.28 |
| 2005/0016685 A1 | * | 1/2005 | Emoto et al. | 156/345.51 |

FOREIGN PATENT DOCUMENTS

| | | |
|---|---|---|
| JP | 11-111599 | 4/1999 |
| JP | 2001-257158 | 9/2001 |

OTHER PUBLICATIONS

J. Phys. E. Sci. Instrum., vol. 14, 1981, "Deflection errors due to sample potential in electron beam lithography machine", M. Miyazaki et al, pp. 194-195.

* cited by examiner

*Primary Examiner*—Michael J Sherry
*Assistant Examiner*—Scott Bauer
(74) *Attorney, Agent, or Firm*—Mattingly, Stanger, Malur & Brundidge, P.C.

(57) ABSTRACT

During the writing operation, the wafer potential is dynamically detected and corrected. By doing so, the positional accuracy of the circuit patterns written on a wafer can be improved. After a contact resistance between a wafer and a earth pin is measured, the current flowing from the wafer to the ground potential via the earth pin is measured. Then, based on the measurement result, the potential difference is given between the wafer and the ground potential.

12 Claims, 11 Drawing Sheets

DISPLACEMENT WHEN WAFER IS CHARGED TO 1V
(8 INCH WAFER)

CHARGED PARTICLE BEAM APPLICATION SYSTEM

CROSS-REFERENCE TO RELATED APPLICATION

The present application claims priority from Japanese Patent Application No. JP 2004-263191 filed on Sep. 10, 2004, and Japanese Patent Application No. JP 2005-243544 filed on Aug. 25, 2005, the contents of which are hereby incorporated by reference into this application.

TECHNICAL FIELD OF THE INVENTION

The present invention relates to semiconductor manufacturing apparatus and semiconductor inspection apparatus used in the semiconductor process. More particularly, it relates to high-speed and highly accurate charged particle beam application system.

BACKGROUND OF THE INVENTION

As one of the major processes for forming patterns of LSI on a semiconductor substrate, the electron beam writing in which electron beam is irradiated to the wafer coated with photosensitive material to form circuit patterns is known. In the electron beam writer, an electrostatic chuck is used to hold and flatten the wafer in vacuum.

FIG. 1 is a cross-sectional view showing a typical electrostatic chucking electrode used in the conventional electron beam writer. The reference numeral 101 denotes a semiconductor wafer (hereinafter, referred to as wafer) to be a sample, 102 denotes a dielectric mainly made of alumina, and 103 denotes a chucking electrode buried in the dielectric 102. The chucking electrode 103 is connected to (+) side of a direct current power supply 105 via a switch 104. A holder 106 holds the wafer 101 by its surface so as to prevent the wafer 101 from floating. Meanwhile, a contact terminal (hereinafter, referred to as earth pin) 107 formed in the shape of a sharp needle is pressed to the rear surface of the wafer 101, and the wafer 101 is connected to the ground potential via the earth pin 107. A base pallet 108 is also connected to the ground potential.

More specifically, by applying direct voltage for the electrostatic chucking to the dielectric 102 between the wafer 101 and the chucking electrode 103 functioning as paired electrodes, the electric charge by the dielectric polarization is generated in the dielectric, thereby acquiring the electrostatic chucking force. This electrostatic chuck has a function to hold the sample so as not to move from a predetermined position and a function to flatten a wafer on which the convex and concave patterns of several tens μm are formed through processes such as the film formation and others so as to match with the flat chucking surface.

Note that, in FIG. 1, the earth pin is in contact with the rear surface of the wafer. However, the same function can be achieved even when it is in contact with the front surface thereof. Also, the chucking electrode is connected to (+) side of the power supply. However, the chucking function remains the same even when it is connected to (−) side thereof.

In this case, the wafer 101 is connected to the ground potential via the earth pin 107. Strictly speaking, however, since the current flowing in the wafer passes through the contact resistance formed at the contact portion between the wafer 101 and the earth pin 107, the potential difference occurs between the wafer 101 and the ground potential. The current flowing in the wafer indicates the leakage current from the chucking electrode 103 to the wafer 101 via the dielectric 102 and the beam current for the beam writing. For example, when the current flowing in the wafer 101 is 5 μA and the contact resistance between the earth pin 107 and the wafer 101 is 200 kΩ, the wafer 101 has the potential of 1 V.

As described above, when the wafer 101 is not kept at the ground potential, the trajectory of electrons as the charged particles is disturbed and the writing accuracy is degraded. J. Phys. E: Sci. Instrum. 14, 194 by M. Miyazaki (1981) discloses that the displacement of written patterns occurs because the amount of deflection of irradiated electrons changes depending on the potential of the wafer. Also, when the wafer 101 is not kept at the ground potential, the difference in potential occurs between the wafer 101 and the base pallet 108 which is kept at the ground potential. Therefore, the electric field which distorts the trajectory of electron beam irradiated to the wafer is generated near the wafer edge. As is evident from above, in order to obtain the high writing accuracy in the electron beam writer, it is necessary to keep the wafer 101 at the ground potential in the electrostatic chuck.

FIG. 4 of Japanese Patent Application Laid-Open Publication No. 2001-257158 discloses an electrostatic chuck in which the chucking electrode of the electrostatic chuck is divided into two parts, the direct current power supply is connected to each part, and an ammeter is connected in series between each direct current power supply and the ground potential. One of the direct current power supplies is a variable direct current power supply. The voltage is applied to the divided chucking electrodes and the voltage applied to the variable direct current power supply is adjusted so as to make the indication values of the ammeters equal to each other. By doing so, the two electrodes form a closed circuit. This closed circuit is formed in order to reduce the amount of leakage current generated between both chucking electrodes and the sample and flowing to the ground potential via the earth pin.

On the other hand, FIG. 1 and FIG. 3 of Japanese Patent Application Laid-Open Publication No. 11-111599 disclose the invention in which potential on the wafer surface is measured by using a surface electrometer to determine the correction voltage value to be applied to the earth pin or the chucking electrode. In this method, since the potential of the wafer is directly measured, not only the leakage current in the dielectric but also the wafer potential by the beam current can be measured at least in principle.

Furthermore, FIG. 2 of Japanese Patent Application Laid-Open Publication No. 11-111599 discloses the invention in which the current value flowing from the chucking electrode is measured and the correction voltage value to be applied to the earth pin is determined based on the measured value. In addition, FIG. 4 of Japanese Patent Application Laid-Open Publication No. 11-111599 discloses the technology in which two earth pins are provided to the wafer, and the difference in potential between one earth pin and the ground potential is measured, and then, the correction voltage value to be applied to the other earth pin is determined based on the measurement result. According to the invention described in Japanese Patent Application Laid-Open Publication No. 11-111599, the wafer potential can be reduced at least in principle.

SUMMARY OF THE INVENTION

In the invention described in Japanese Patent Application Laid-Open Publication No. 2001-257158 and FIG. 2 of Japanese Patent Application Laid-Open Publication No. 11-111599, an ammeter is provided between the direct current power supply and the chucking electrode and between the direct current power supply and the ground potential.

More specifically, the current value flowing from the wafer to the chucking electrode via the dielectric is measured. Also, although the resistance between the wafer and the chucking electrode is kept high due to the dielectric, the contact resistance between the wafer and the earth pin is much lower than that. Therefore, most of the charged particle beam irradiated to the wafer flows to the earth pin. In the invention described above, since the current flowing from the wafer to the earth pin is not measured, even if the correction voltage is calculated based on the measured current value, it is impossible to obtain the right value.

Meanwhile, when the surface electrometer is used as described in FIG. 1 and FIG. 3 of Japanese Patent Application Laid-Open Publication No. 11-111599, the surface potential of the wafer can be directly measured. However, the response of the highly accurate surface electrometer is slow in comparison to the change in beam current during the beam writing. Therefore, it is difficult to calculate the correction voltage at high speed. That is, the high-speed correction for dynamically correcting the wafer potential during the writing is impossible when using the surface electrometer.

When one of the two earth pins in contact with the wafer is used for the potential measurement and the power supply is connected to the other earth pin as shown in FIG. 4 of Japanese Patent Application Laid-Open Publication No. 11-111599, the surface potential of the wafer can be corrected at least in principle. However, this method is based on the premise that the resistance of the two earth pins is low. On the other hand, the contact resistance between the earth pin and the wafer largely differs depending on the characteristics thereof, and the reproducibility thereof is not ensured. Therefore, it is difficult to always correct the wafer potential accurately by this method.

In recent years, due to the increase of leakage current resulting from the increase of the wafer size and the increase of beam current for the enhancement of the throughput, the probability of the wafer charging is increased more than ever. On the other hand, in order to increase the accuracy, the reduction of wafer potential is further demanded.

An object of the present invention is to provide an electrostatic chuck capable of reducing the wafer potential more than ever and a charged particle beam application system in which the electrostatic chuck is mounted.

For the solution of the problems described above, the electrostatic chuck according to the present invention comprises: chucking electrodes; a power supply for applying direct voltage to the chucking electrode; a contact terminal in contact with a sample; means for measuring current flowing from the sample to ground potential via the contact terminal, which is provided between the contact terminal and the ground potential; and a power supply for correcting wafer potential, which applies correction voltage to the chucking electrode or the contact terminal. Regardless of the monopolar type and the bipolar type, any chucking electrode can be used as long as it is provided with the means for measuring the current flowing in the ground potential via the contact terminal. Therefore, the current value from the wafer generated due to both the beam current and the leakage current can be measured more accurately than ever before. As a result, it is possible to calculate the correction voltage value more accurately than ever before.

The power supply for correcting wafer potential is connected to the earth pin in the case of the monopolar type. In the case of the bipolar type, it can be connected to either the earth pin or one of the chucking electrodes of the bipolar type.

In the electrostatic chuck of the charged particle beam application system, the potential of the sample can be corrected even during the sample processing. Therefore, it is possible to improve the irradiation position accuracy of the charged particle beam.

BRIEF DESCRIPTIONS OF THE DRAWINGS

Figure 9A:
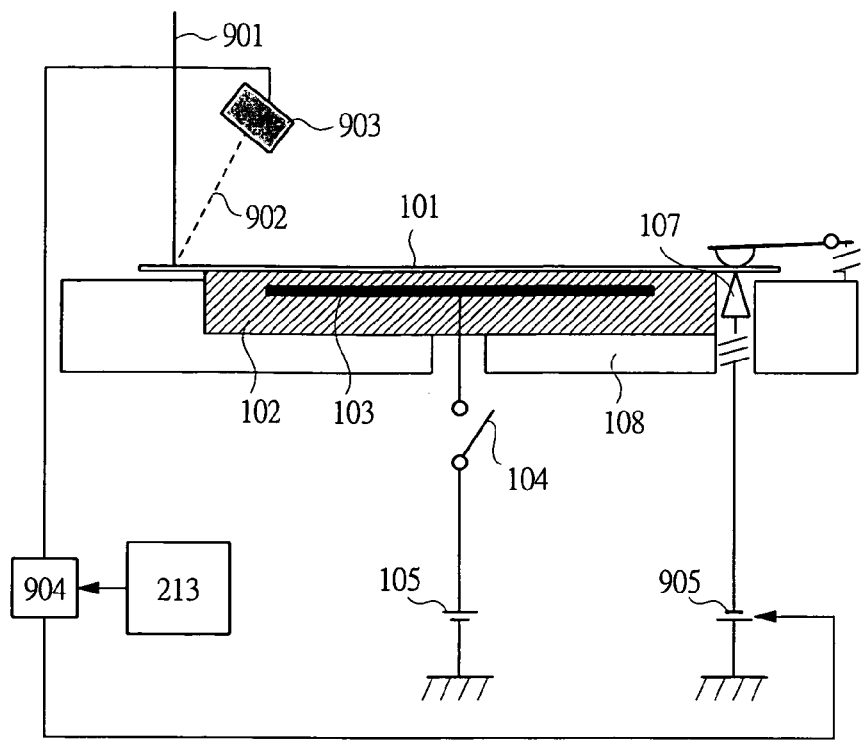
Figure 9B:
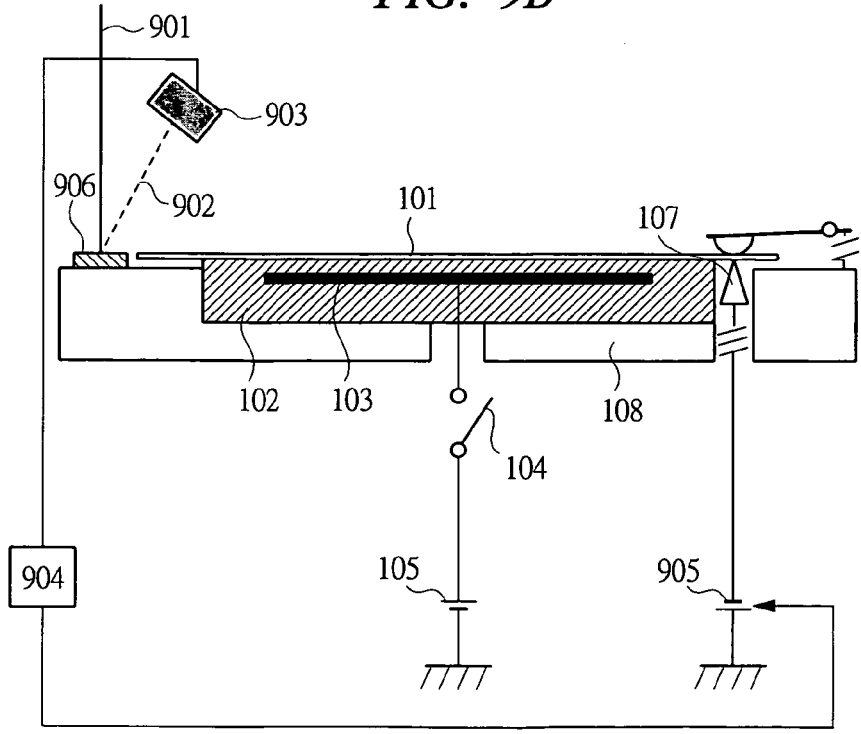
Figure 10A:
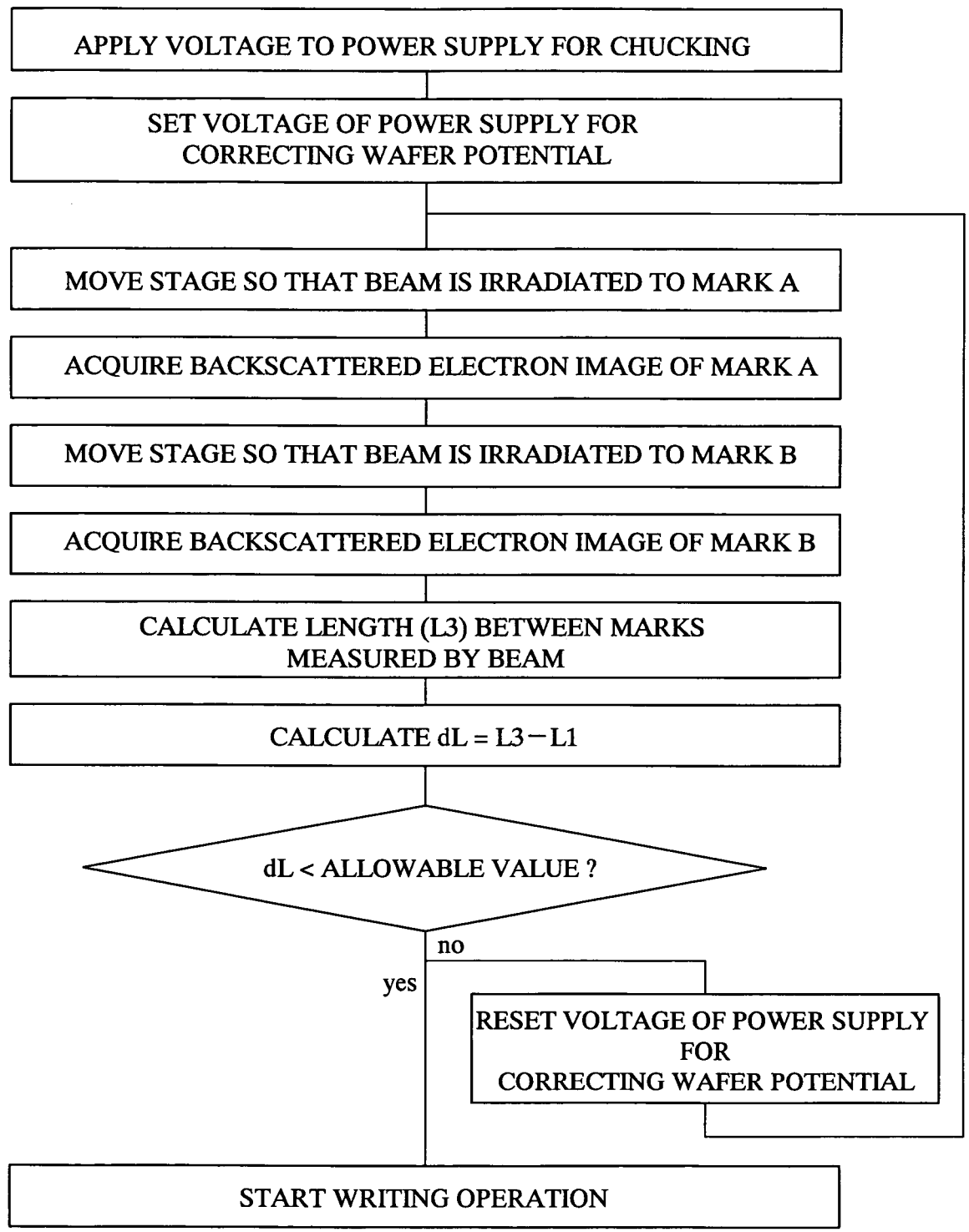
Figure 10B:
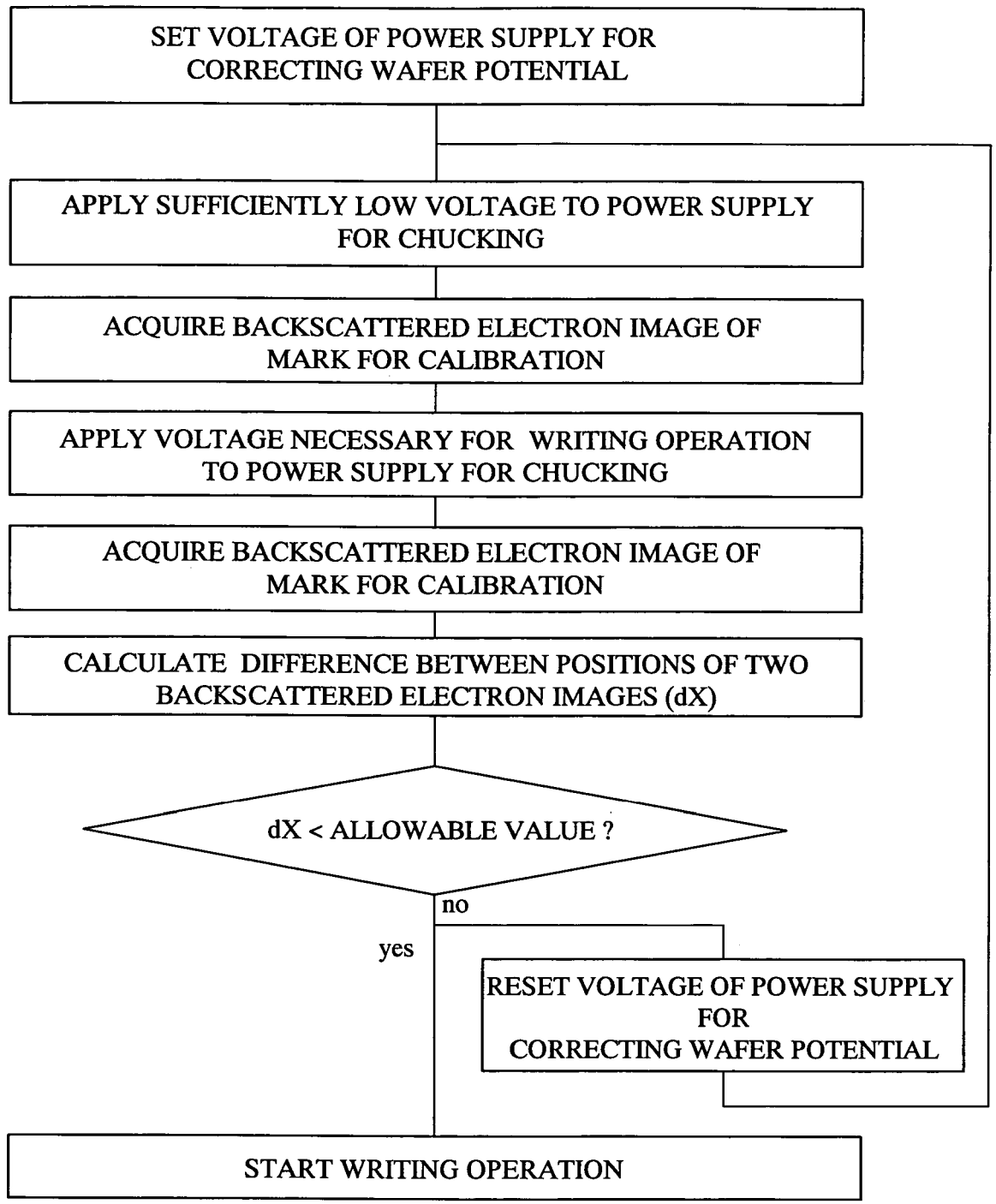

FIG. 9A is a schematic diagram showing the electrostatic chuck for describing the seventh embodiment of the present invention, and FIG. 9B is a schematic diagram showing the electrostatic chuck for describing the sixth embodiment of the present invention; and FIG. 10A is a flowchart for describing the seventh embodiment of the present invention, and FIG. 10B is a flowchart for describing the sixth embodiment of the present invention.

DESCRIPTIONS OF THE PREFERRED EMBODIMENTS

Hereinafter, embodiments of the present invention will be described below based on the accompanying drawings.

First Embodiment

Figure 2:
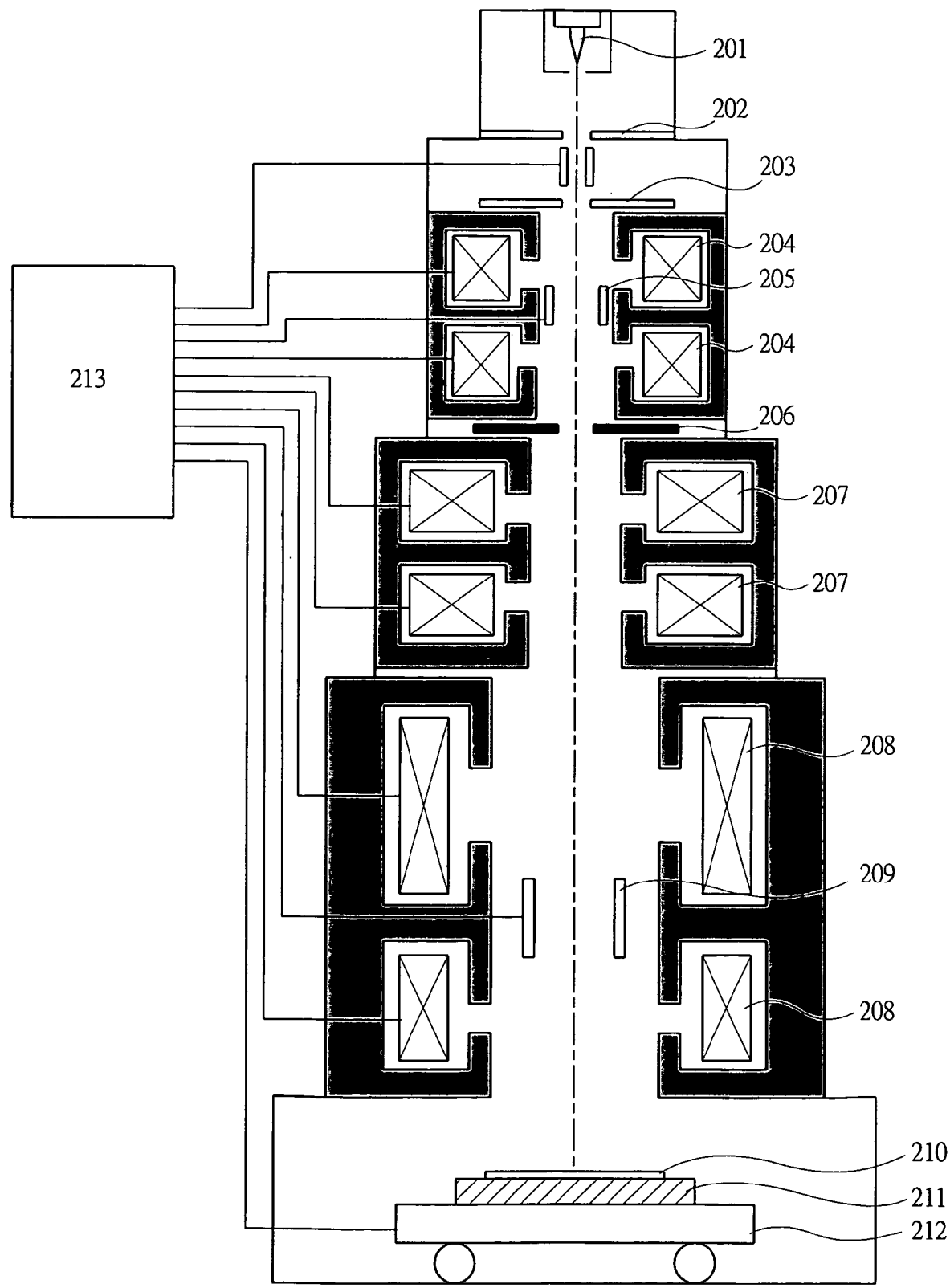
FIG. 2 is a block diagram showing the entire configuration of the electron beam writer.

FIG. 2 is a schematic diagram showing the entire configuration of the electron beam writer. Electron beam emitted from a thermionic electron gun 201 is accelerated toward an anode electrode 202, and then, directly irradiated to a first mask 203. The first mask 203 has a rectangular opening and an image of the opening is obtained by the irradiated electron beam. The image of the opening of the first mask is formed on a second mask 206 by a shaping lens 204. A rectangular opening for performing the variable shaping irradiation and a shaping opening for performing the collective pattern irradiation are formed in the second mask. An imaging position on the second mask is controlled by a beam shaping deflector 205, and the shape and the area of the electron beam are thus determined. The electron beam passing through the opening of the second mask is projected on a wafer 210 serving as a sample by a reduction lens 207 and an objective lens 208. A deflector 209 is provided in the objective lens, and the imaging position of the electron beam on the sample is determined by the deflector.

The wafer 210 on which the writing is done in this embodiment is mounted on a stage 212 via a pallet 211. The pallet 211 also functions as an electrostatic chuck and fixes the wafer 210 to the pallet 211 by the electrostatic force. Further, by fixing the pallet 211 onto the stage 212, the wafer 210 can move at high speed with high accuracy together with the stage 212 during the writing operation. All of the optical elements including the shaping lens 204 and the shaping deflector 205, the detector (not shown) and the stage 212 are controlled by a control circuit 213 based on the circuit patterns to be written. Although not shown, the control circuit 213 is provided with display device such as a monitor screen and input means such as a keyboard, and various types of information required for the control of the writer can be inputted to the writer through the input means by the user of the writer.

Next, the electrostatic chuck in this embodiment will be described with reference to the schematic diagram of FIG. 3. The electrostatic chuck according to this embodiment is the so-called bipolar type in which the chucking electrode is divided into two parts. A dielectric 102 is provided in an electron optical column of the electrostatic chuck, and the surface of the dielectric 102 functions as a mounting surface of a wafer. A through hole is formed in the outer edge part of the column, and an earth pin 107 for connecting the wafer to the ground is provided. Direct current power supplies 303 and 304 are electrically connected to chucking electrodes 301 and 302 buried in the dielectric 102 via switches 104, and potential differences V1 and V2 are given between the chucking electrodes 301 and 302 and the ground potential, respectively. The direct current power supply 304 is a variable direct current power supply. Note that, in FIG. 3, the direct current power supply 303 is shown as a variable direct current power supply. However, a fixed direct current power supply is also available.

When only the leakage current is considered regardless of the beam current, the sum of the current flowing from the two chucking electrodes 301 and 302 to the wafer 101 flows to the ground potential from the wafer 101 via the earth pin 107. At this time, since the contact resistance is formed between the wafer 101 and the earth pin 107, the difference in potential is created between the wafer 101 and the ground potential.

Figure 4A:
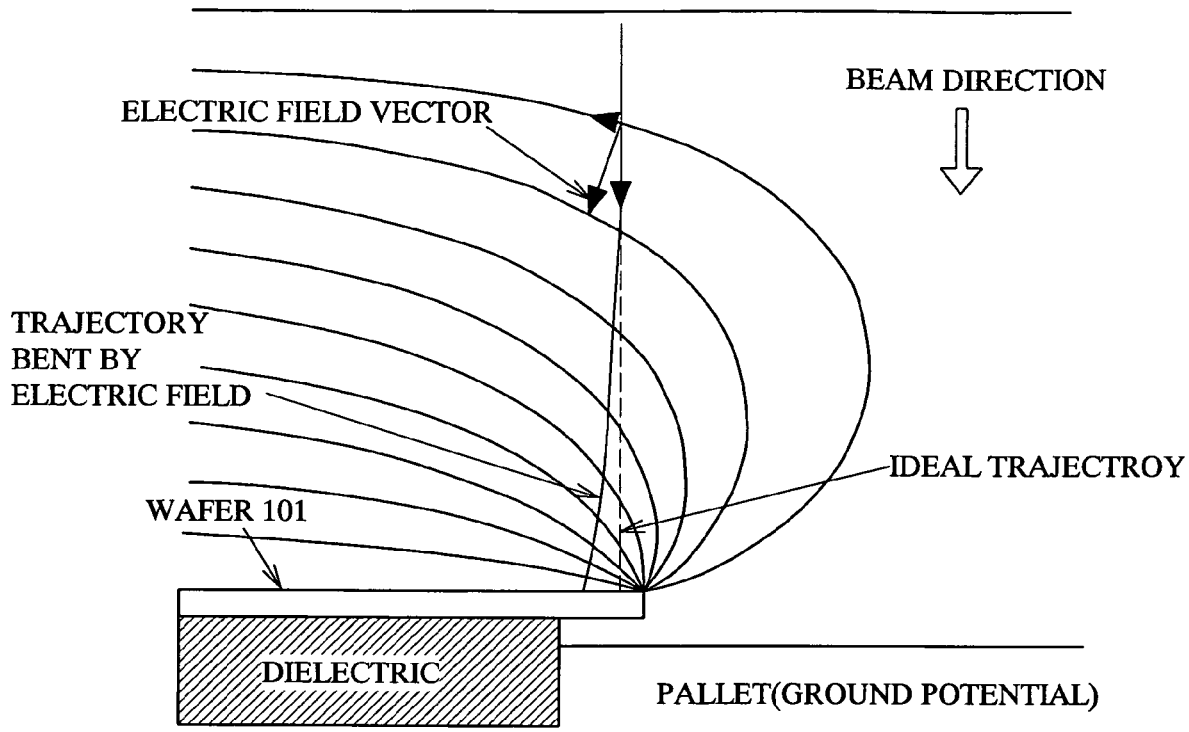
FIG. 4A is a diagram showing the potential distribution near the edge of a wafer having the potential of 1 V.
Figure 4B:
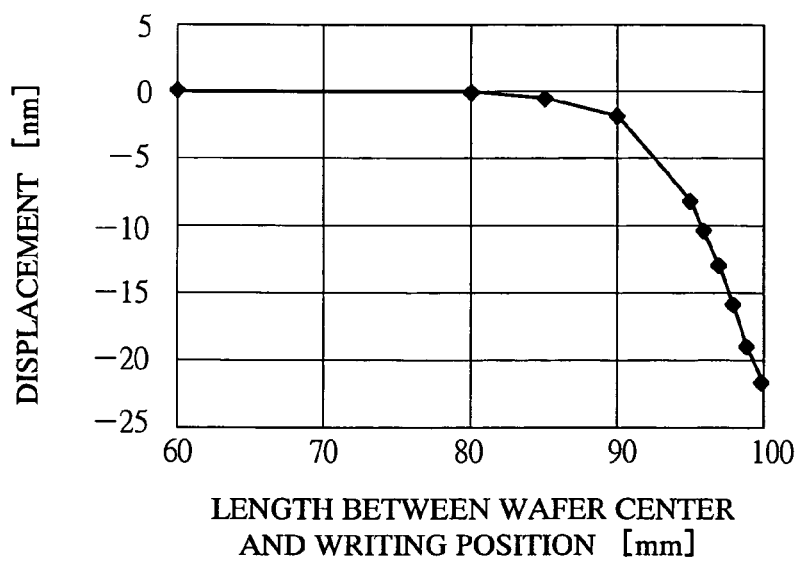
FIG. 4B is a graph showing the amount of displacement of the electron beam at the wafer edge when the wafer has the potential of 1 V.

FIG. 4A is a diagram showing the electric field distribution near the wafer edge when the difference in potential is created between the wafer 101 and the ground potential. The equipotential lines which should be parallel to the wafer surface are distorted due to the difference in potential between the wafer and the pallet. Therefore, the electric field vector has the components vertical to the traveling direction of the beam. As a result, the trajectory of the electron beam is bent and it deviates from the ideal trajectory. More specifically, the written patterns on the wafer edge part are displaced. FIG. 4B is a graph showing the result of the simulation in which the amount of displacement of the electron beam reaching the wafer is calculated when the potential of 1 V is generated on the wafer. The horizontal axis represents the length in a radial direction from the center of the wafer which is the irradiating position of the electron beam and the vertical axis represents the amount of displacement of the electron beam, respectively. The vertical axis of FIG. 4B shows the displacement amount in the outward direction of the wafer as a positive value and the displacement amount in the inward direction of the wafer as a negative value. The diameter of the wafer is assumed to be 200 mm. As is evident from FIG. 4B, it can be understood that the amount of displacement increases nearer the wafer edge.

Figure 1:
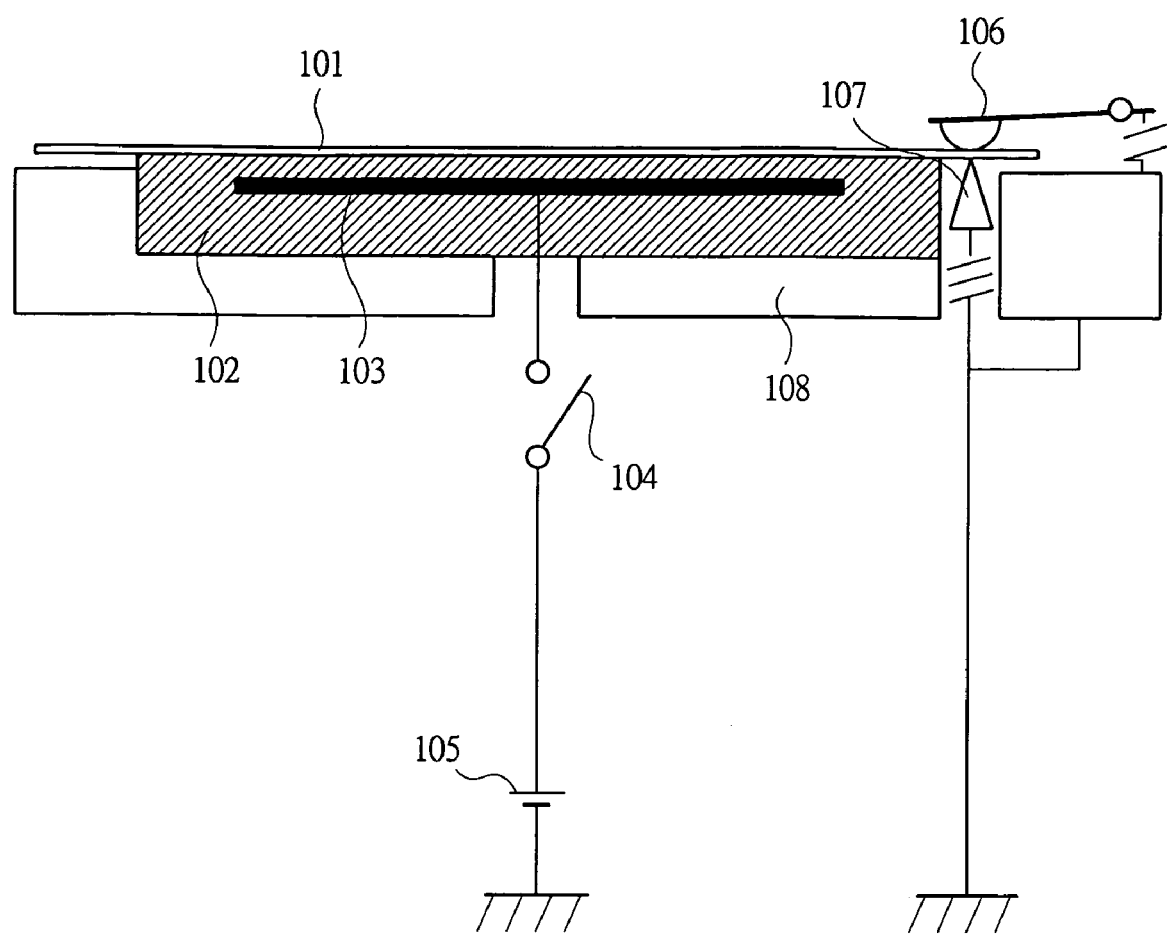
FIG. 1 is a schematic diagram showing the conventional electrostatic chuck.
Figure 3:
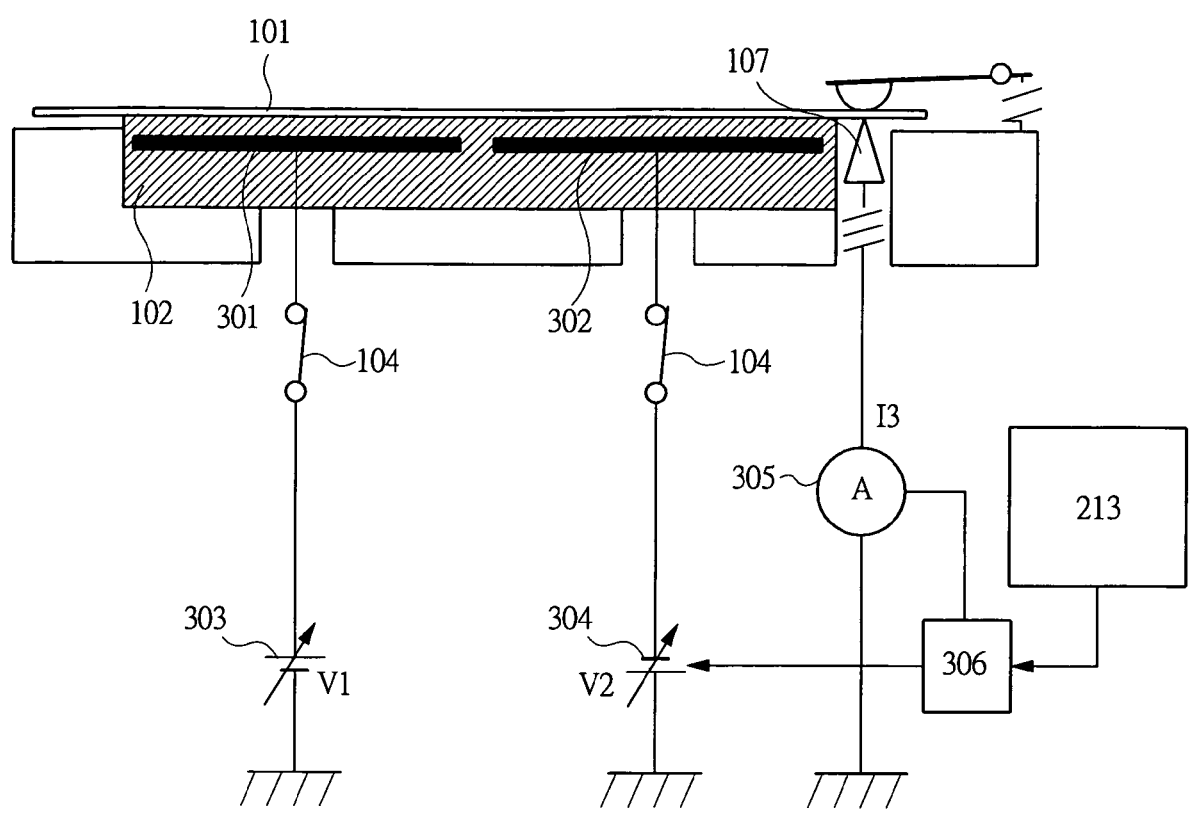
FIG. 3 is a schematic diagram showing the electrostatic chuck for describing the first embodiment of the present invention.

For its solution, conventionally, as described in FIG. 4 of Japanese Patent Application Laid-Open Publication No. 2001-257158 and FIG. 1 and FIG. 3 of Japanese Patent Application Laid-Open Publication No. 11-111599, the direct current power supply is connected to each of the bipolar electrodes to form a closed circuit between the two electrodes. By doing so, the current value flowing from the chucking electrode to the wafer 101 is reduced. However, in the conventional methods, it is difficult to accurately measure the wafer potential. Therefore, the proper correction voltage cannot be given, and the leakage current cannot be sufficiently reduced in some cases.

In this embodiment, current measurement means such as an ammeter 305 is provided between the earth pin 107 and the ground potential. Under the control of the control circuit 213 of the entire writer, a feedback circuit 306 adjusts the output of the direct current power supply 304 so as to minimize the absolute value of the current measured by the ammeter 305. Since the current flowing from the wafer 101 to the ground potential via the earth pin 107 is directly measured, the wafer potential can be measured more accurately than ever before, and more complete closed circuit can be formed between both the chucking electrodes. Also, in the method described in FIG. 4 of Japanese Patent Application Laid-Open Publication No. 2001-257158, two ammeters having the uniform gain and offset are required. On the other hand, this embodiment requires only one ammeter. Also, even when the accuracy of the gain of the ammeter 305 is not so good, if only the offset is well adjusted, the condition in which the sum of the current flowing from the two chucking electrodes 301 and 302 to the wafer 101 is minimized can be found. Therefore, it is possible to use a relatively inexpensive ammeter with lower accuracy.

Since the wafer potential is corrected before the writing operation in this embodiment, the sum total of the current flowing from the chucking electrode to the wafer can be minimized. Therefore, since it is possible to maintain the good positional accuracy even in the chips on the wafer edge part, the number of chips obtained from one wafer can be increased.

Since the sum total of the current from the chucking electrode to the wafer can be reduced more than ever, the potential of the wafer can be more efficiently corrected before the writing operation. Also, when the electron beam exposure system mounted with the electrostatic chuck according to this embodiment is used, the positional accuracy can be maintained even in the chips on the wafer edge part. Therefore, the number of chips obtained from one wafer can be increased.

Second Embodiment

In the first embodiment, the direct current power supply is connected to each of the bipolar electrodes to form the closed circuit between the two electrodes. By doing so, the current value flowing from the chucking electrode to the wafer is reduced. In an actual case, however, the beam current is irradiated to the wafer in addition to the leakage current from the chucking electrode. Most of the electron beam flows to the ground potential via an earth pin. This is because, although the resistance between the wafer and the chucking electrode is kept high by the dielectric, the contact resistance between the wafer and the earth pin is much lower.

Therefore, even if the sum total of the leakage current flowing from the chucking electrode to the wafer is reduced in accordance with the method of the first embodiment, when the irradiation of the beam current is started, the difference in potential occurs between the wafer and the ground potential. Therefore, in the second embodiment, in order to correct the wafer potential due to the beam current during the writing operation, the power supply for correcting wafer potential is used in addition to the direct current power supply connected to the chucking electrode. Note that, in the following description, the electrostatic chuck of this embodiment is mounted in the electron beam writer.

Figure 5A:
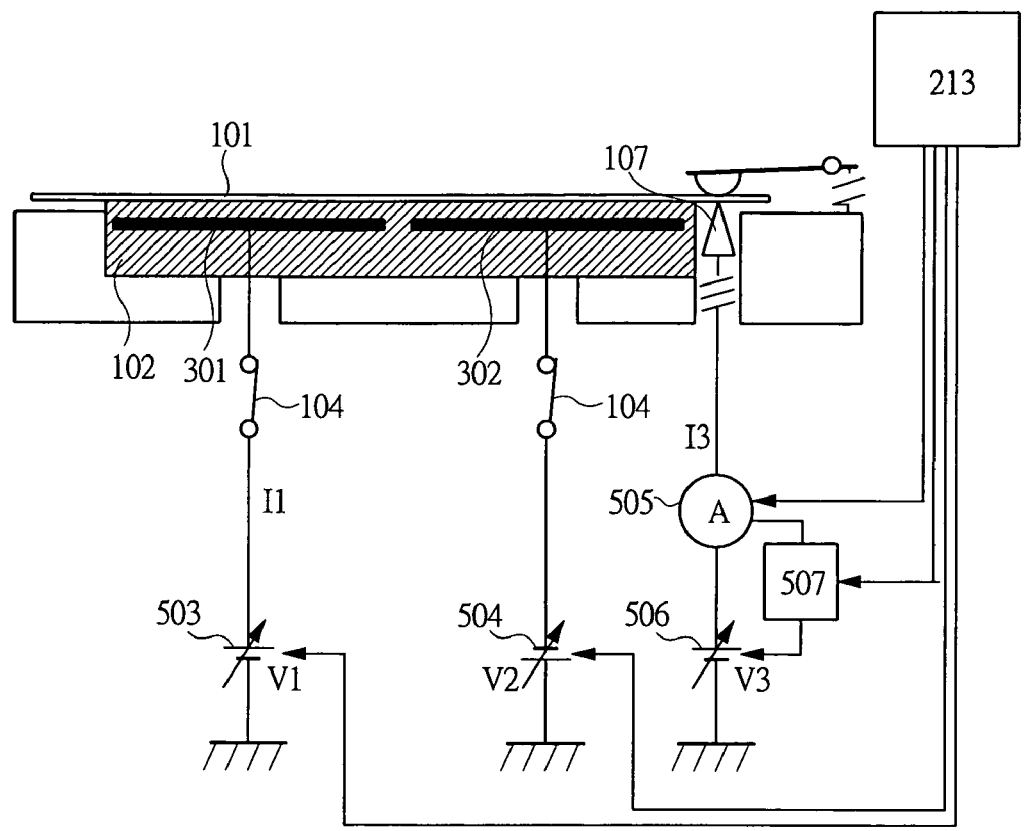
FIG. 5A is a schematic diagram showing the electrostatic chuck for describing the second embodiment of the present invention.

The electrostatic chuck according to the second embodiment will be described with reference to the schematic diagram of FIG. 5A. The electrostatic chuck according to this embodiment is the so-called bipolar type in which the chucking electrode is divided into two parts. Direct current power supplies 503 and 504 are connected to the chucking electrodes 301 and 302 buried in the dielectric 102 via the switches 104, and potential differences V1 and V2 are given between the chucking electrodes 301 and 302 and the ground potential, respectively.

The earth pin 107 pressed to the rear surface of the wafer 101 is connected to the ground potential via an ammeter 505 and a power supply for correcting wafer potential 506. In this case, the power supply for correcting wafer potential 506 gives the potential difference V3 by direct current between the ground potential and the earth pin 107, and the ammeter 505 measures the current flowing from the wafer 101 to the ground potential via the earth pin 107.

In the charged particle beam application system mounted with the electrostatic chuck according to this embodiment, when the instruction to start the writing operation is issued from the user of the writer or the control program of the writer, the contact resistance between the earth pin 107 and the wafer 101 is measured in accordance with the following procedure.

(1) After setting the output of the power supply for correcting wafer potential at 0 V, the control circuit 213 of the entire writer measures the current I3 flowing from the wafer 101 to the ground potential via the earth pin 107 by the ammeter 505 and adjusts at least one of the voltage V1 applied to the chucking electrode 310 and the voltage V2 applied to the chucking electrode 302 so as to set the current I3 equal to 0. By doing so, the sum total of the current flowing from the chucking electrode to the wafer is minimized.

(2) Next, the power supply for correcting wafer potential 506 gives the potential difference V3 by the direct current between the ground potential and the earth pin 107. At this time, when the current I3 flowing from the wafer 101 to the ground potential via the earth pin 107 is measured by the ammeter 505, the contact resistance R3 between the earth pin 107 and the wafer 101 can be obtained from the following expression.

$$R3=V3/I3$$

After obtaining the contact resistance R3 between the earth pin 107 and the wafer 101 in the manner described above, the writing operation is started. The obtained value of the resistance R3 is stored in storage means such as a memory of the control circuit 213 or an external storage device.

Figure 5B:
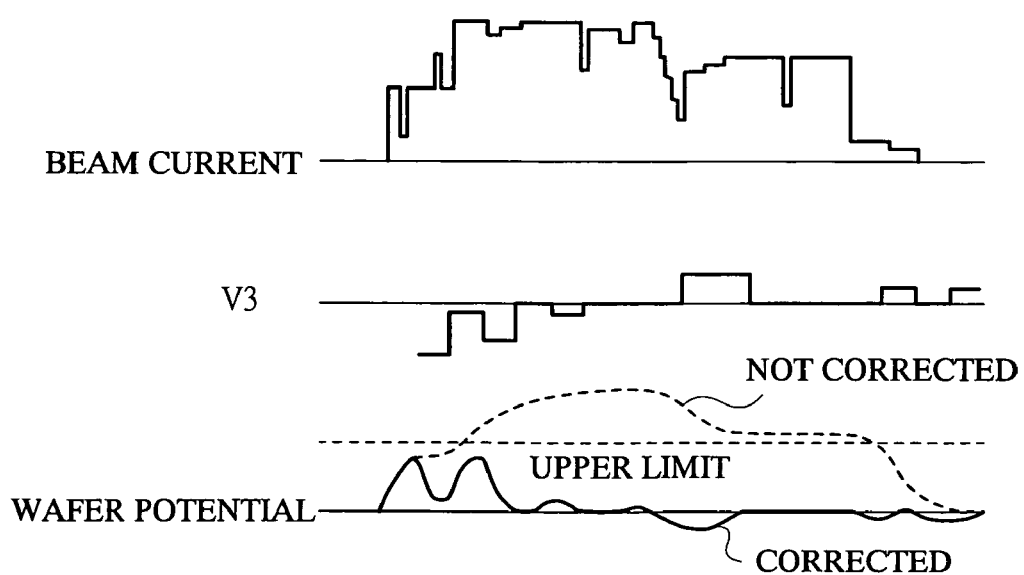
FIG. 5B is a time chart for describing the second embodiment of the present invention.

FIG. 5B is a time chart showing the relation among the beam current, the voltage V3 of the power supply for correcting wafer potential, and the wafer potential after starting the writing operation.

After starting the writing operation, the amount of deflection and the shape of the electron beam are changed in accordance with the patterns to be written. The beam current is also changed along with them. In the conventional case, since the current from the wafer via the earth pin is directly connected to the ground potential, the wafer potential gradually follows the change in beam current as shown by the dotted line in FIG. 5B. This is because the RC circuit is formed by the electrostatic capacitance formed between the wafer and the chucking electrode and the contact resistance between the wafer and the earth pin. As a result, the wafer potential exceeds the upper limit thereof capable of realizing the writing with a required accuracy in some cases.

On the other hand, in this embodiment, the current I3 flowing from the wafer 101 to the ground potential via the earth pin 107 is monitored by using the ammeter 505, and the potential of the wafer 101 is corrected by the power supply for correcting wafer potential 506. More specifically, under the control of the control circuit 213 of the entire writer, a feedback circuit 507 sets the voltage V3 applied to the power supply for correcting wafer potential 506 so as to satisfy the following expression.

$$V3=I3 \times R3$$

In this case, R3 is the contact resistance between the earth pin 107 and the wafer 101 measured in advance before the writing operation.

In an actual case, as shown in FIG. 5B, the voltage V3 applied to the power supply for correcting wafer potential 506 is changed at each predetermined time interval. The wafer potential is corrected at the interval equivalent to the response time of the ammeter. By doing so, as shown in FIG. 5B, it is possible to continue the writing operation while suppressing the change in wafer potential more than ever.

Note that, when it is necessary to reduce the frequency of the correction, the allowable value of the wafer potential is determined in advance based on the relation between the wafer potential and the displacement amount shown in FIG. 2B so that the correction is performed only when I3×R3 exceeds the allowable value. In this case, the upper limit of the wafer potential is stored in the storage means in the control circuit 213. Alternatively, the time information showing the frequency to perform the correction is stored in the control circuit 213 and the correction is performed with the frequency based on the stored information.

According to the second embodiment, the correction of the wafer potential can be performed during the writing operation, and thus, it is possible to reduce the wafer potential due to the beam current flowing to the wafer. Also, in the electrostatic chuck according to this embodiment, it is possible to use the higher beam current in the writing operation in comparison to the case of the first embodiment in which only the leakage current flowing from the chucking electrode to the wafer is reduced. Therefore, the writing time for each wafer can be reduced, and the throughput can be improved.

Note that the number of earth pins required in this embodiment is one. This is advantageous when considering the probability of the foreign matter formation due to the contact of the wafer and the earth pin. Even when two or more earth pins are used, after obtaining the contact resistances between respective earth pins and the wafer, the combined resistance thereof is obtained, and then, the two earth pins are used in the same manner as that of the one earth pin. By doing so, the same effect as that of the second embodiment can be achieved. Also, the electrostatic chuck according to the second embodiment can be mounted not only in the writer shown in FIG. 2 but also in other charged particle beam application system such as the CD-SEM (Critical-Dimension Scanning Electron Microscope).

Third Embodiment

Figure 6:
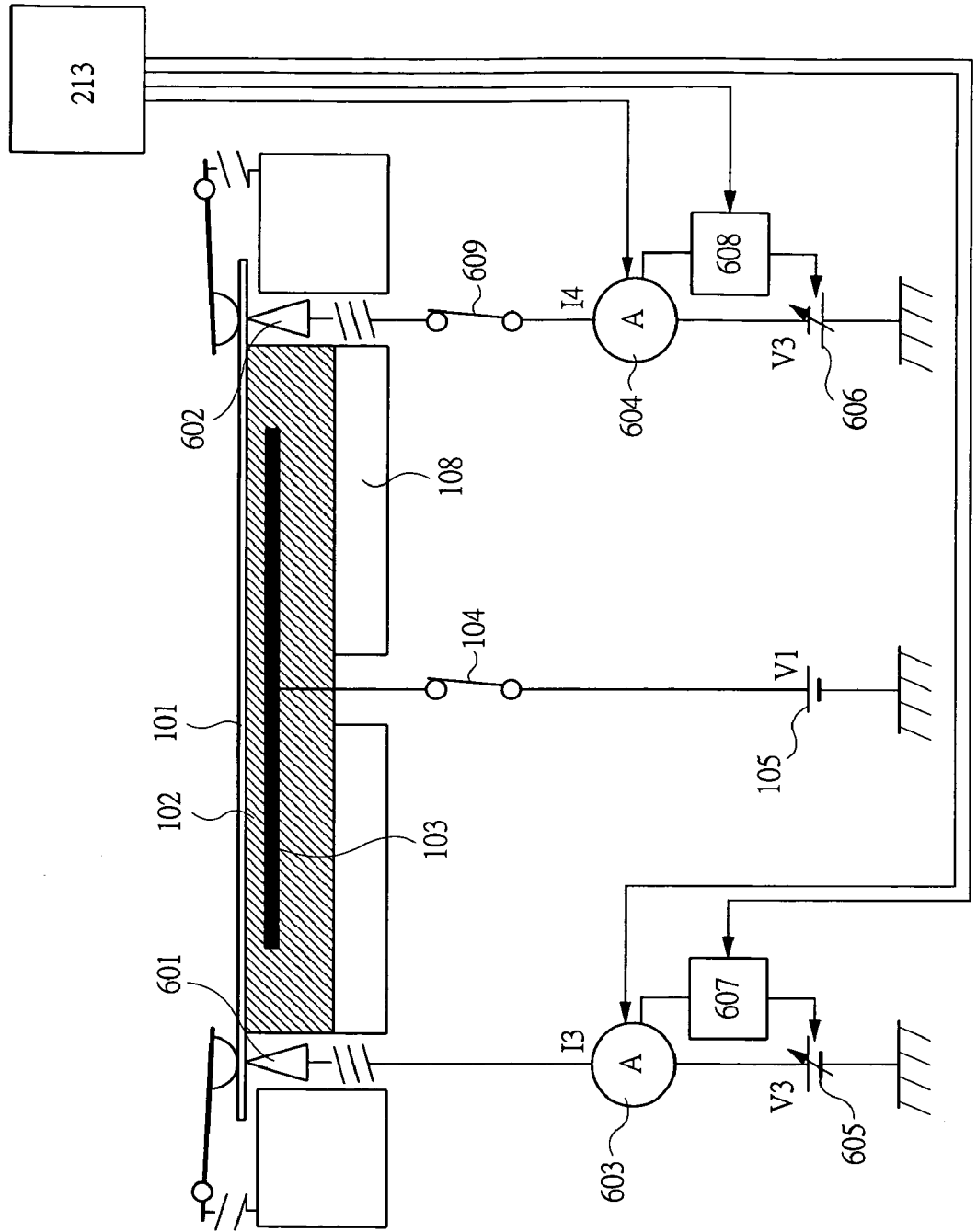
FIG. 6 is a schematic diagram showing the electrostatic chuck for describing the third embodiment of the present invention.

The electrostatic chuck according to the third embodiment will be described with reference to the schematic diagram of FIG. 6. In addition, similar to the first embodiment, the electrostatic chuck of this embodiment is mounted in the electron beam writer shown in FIG. 2.

In this embodiment, the case where a plurality of earth pins are used will be described. The direct current power supply 105 is connected to the chucking electrode 103 buried in the dielectric 104 via the switch 104, and the potential difference V1 is given between the ground potential and the chucking electrode 103. In this third embodiment, two earth pins 601 and 602 are pressed to the rear surface of the wafer 101. Power supplies for correcting wafer potential 605 and 606 are connected to each of the earth pins via ammeters 603 and 604, respectively. The power supplies for correcting wafer potential 605 and 606 give the potential differences V3 and V4 by direct current between the ground potential and the earth pins, respectively, and the ammeters 603 and 604 measure the current flowing from the wafer 101 to the ground potential via the earth pins 601 and 602.

Under the control of the control circuit 213 of the entire writer, a feedback circuit 607 adjusts the power supply for correcting wafer potential 605 so that the current value measured by the ammeter 603 becomes the predetermined value. Similarly, under the control of the control circuit 213 of the entire writer, a feedback circuit 608 adjusts the power supply for correcting wafer potential 606 so that the current value measured by the ammeter 604 becomes the predetermined value. Note that, though not shown, the open/close operation of the switches 104 and 609 is also controlled by the control circuit 213.

In the charged particle beam application system mounted with the electrostatic chuck according to this embodiment, when the instruction to start the writing operation is issued from the user of the writer or the control program of the writer, the contact resistances between the earth pins 601 and 602 and the wafer 101 are measured in accordance with the following procedure.

The control circuit 213 of the entire writer outputs the instruction to the feedback circuit 608 for giving the voltage to make the current I4 flowing from the wafer 101 to the ground potential via the earth pin equal to 0 to the power supply for correcting wafer potential 606. The feedback circuit 608 calculates the voltage applied to the power supply for correcting wafer potential 605 based on the current value I4 measured by the ammeter 604 and adjusts the voltage V4 of the power supply for correcting wafer potential 606.

At this time, the wafer potential is V4, and all of the current flowing to the wafer flows to the ground potential via the earth pin 601. Therefore, based on the current I3 measured by the ammeter 603 and the voltage V3 of the power supply for correcting wafer potential 605, the contact resistance R3 between the earth pin 601 and the wafer 101 can be obtained from the following expression. The obtained contact resistance value R3 is stored in the storage device in the writer.

$$R3=(V4-V3)/I3$$

After obtaining the contact resistance R3 between the earth pin 601 and the wafer 101 in the manner described above, the writing operation is started. Note that, in the writing operation, since one earth pin is enough to determine the potential of the wafer 101, the switch 609 is released. Alternatively, the earth pin 602 is separated from the wafer 101. In this case, driving means for driving the earth pin 602 is necessary.

The monitoring and the correction of the potential of the wafer 101 are performed in the same manner as that of the second embodiment. More specifically, the current I3 flowing from the wafer 101 to the ground potential via the earth pin 601 is monitored by using the ammeter 603, and the potential of the wafer 101 is corrected by the power supply for correcting wafer potential 605. That is, under the control of the control circuit 213 of the entire writer, the feedback circuit 607 sets the output voltage V3 of the power supply for correcting wafer potential 605 based on the following expression.

$$V3=-I3 \times R3$$

By performing the correction of the wafer potential during the writing operation in accordance with the third embodiment, the same effect as that of the second embodiment can be achieved.

Different from the second embodiment, the third embodiment can be realized even if the chucking electrode is either the monopolar type or the bipolar type.

Note that, in the third embodiment, only one of the two earth pins is used in the writing operation. However, in the case where it is necessary to reduce the contact resistance between the wafer and the earth pin as much as possible, both of the two earth pins are brought into contact with the wafer and then connected to the ammeter 603 in parallel. Also, the electrostatic chuck according to the third embodiment can be mounted not only in the writer shown in FIG. 2 but also in other charged particle beam application system such as the CD-SEM.

Fourth Embodiment

Figure 7:
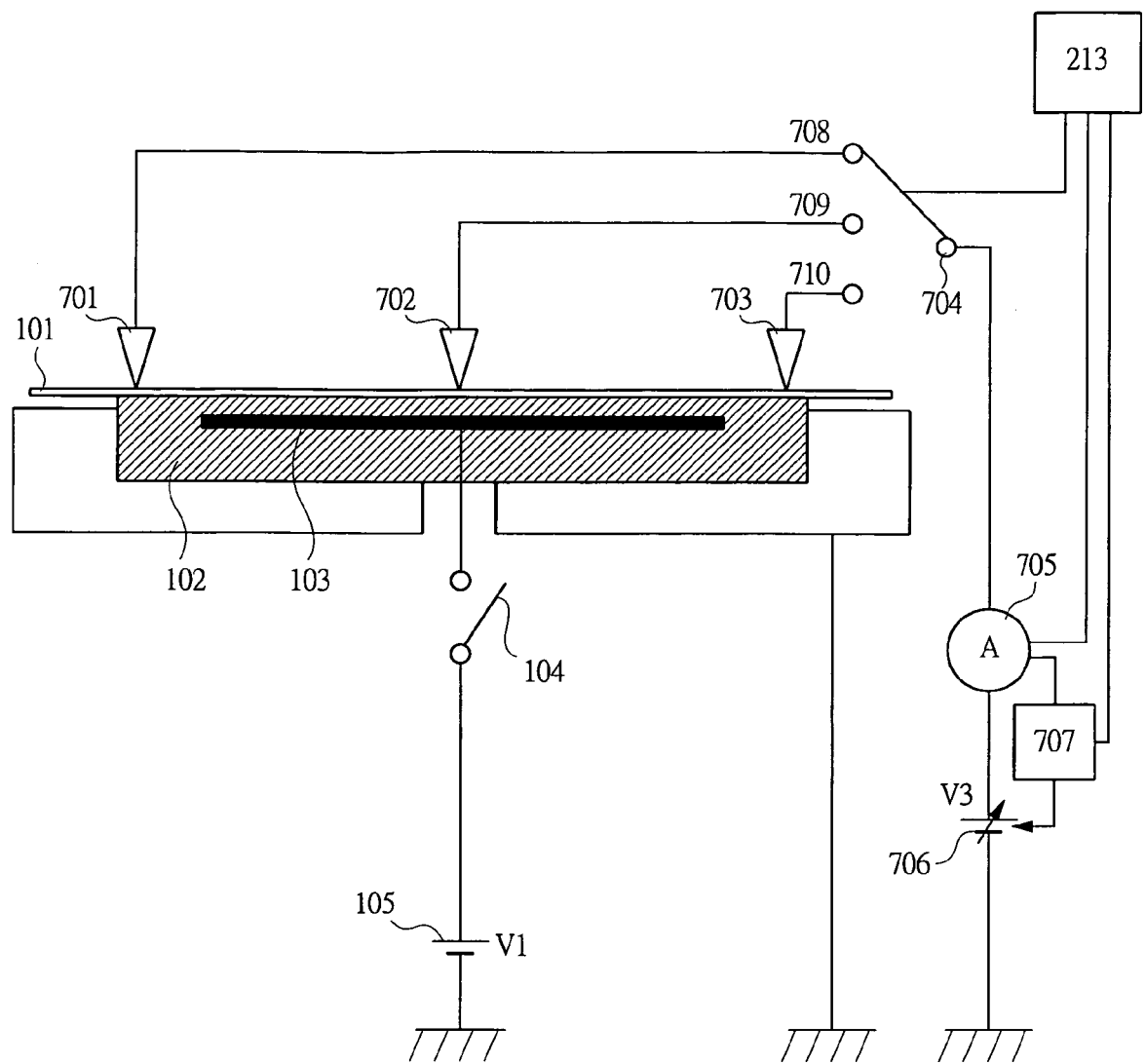
FIG. 7 is a schematic diagram showing the electrostatic chuck for describing the fourth embodiment of the present invention.

The electrostatic chuck according to the fourth embodiment will be described with reference to the schematic diagram of FIG. 7. Similar to the first embodiment, the electrostatic chuck according to this embodiment is mounted in the electron beam writer shown in FIG. 2.

The direct current power supply 105 is connected to the chucking electrode 103 buried in the dielectric 102 via the switch 104, and the potential difference V1 is given between the ground potential and the chucking electrode 103. In this embodiment, three earth pins 701, 702 and 703 are pressed to the surface of the wafer 101.

In the charged particle beam application system mounted with the electrostatic chuck according to this embodiment, when the instruction to start the writing operation is issued from the user of the writer or the control program of the writer, the contact resistances between the earth pins 701, 702 and 703 and the wafer 101 are measured in accordance with the following procedure.

First, the electric resistance R12 between a terminal 708 connected to the earth pin 701 and a terminal 709 connected to the earth pin 702 is measured by using a tester. Similarly, the electric resistance R23 between the terminal 709 connected to the earth pin 702 and a terminal 710 connected to the earth pin 703 and the electric resistance R31 between the terminal 710 connected to the earth pin 703 and the terminal 708 connected to the earth pin 701 are also measured by using a tester.

At this time, when the contact resistance between the earth pin 701 and the wafer 101 is R1, the contact resistance between the earth pin 702 and the wafer 101 is R2, and the contact resistance between the earth pin 703 and the wafer 101 is R3, the following expressions are true.

$$R12=R1+R2$$

$$R23=R2+R3$$

$$R31=R3+R1$$

That is, if the resistances R12, R23 and R31 can be obtained by measurement, the resistances R1, R2 and R3 can be obtained from the expressions described above.

In general, if there are three or more earth pins in contact with the wafer, the number of parameters obtained by the measurement is increased in comparison to the number of unknown contact resistances between the respective earth pins and the wafer. Therefore, it becomes possible to individually obtain the contact resistances between the respective earth pins and the wafer.

After individually obtaining the contact resistances R1, R2 and R3 between the earth pins 701, 702 and 703 and the wafer 101 in the manner described above, the writing operation is started. In the writing operation, since one earth pin is enough to determine the potential of the wafer 101, one terminal is selected from the terminals 708 to 710 by using the switch 704 under the control of the control circuit 213 of the entire writer. In the case where it is necessary to reduce the contact resistance between the wafer and the earth pin as much as possible, two or more terminals are selected and the combined resistance from the wafer to the switch 704 is calculated.

The monitoring and the correction of the potential of the wafer 101 during the writing operation are performed in the same manner as that of the second embodiment. More specifically, the current I3 flowing from the wafer 101 to the ground potential via the selected earth pin is monitored by using the ammeter 705, and the potential of the wafer 101 is corrected by the power supply for correcting wafer potential 706. That is, under the control of the control circuit 213 of the entire writer, the feedback circuit 707 sets the voltage V3 applied to the power supply for correcting wafer potential 706 based on the following expression.

$$V3=-I3\times R3$$

By performing the correction of the wafer potential during the writing operation in accordance with the fourth embodiment, the same effect as that of the second embodiment can be achieved.

Similar to the third embodiment, the fourth embodiment can be realized even if the chucking electrode is either the monopolar type or the bipolar type.

In addition, since the contact resistance between the earth pin and the wafer is directly measured in this embodiment, the higher accuracy can be obtained in comparison to the indirect measurement in the second and third embodiments.

Note that, in the second to fourth embodiments, the irradiation amount of electron beam is monitored by using an ammeter to correct the wafer potential. However, the same effect can be obtained also when the irradiation amount of electron beam is sequentially calculated based on the pattern data to be written and the wafer potential is corrected based on this data.

Furthermore, the electrostatic chuck according to the fourth embodiment can be mounted not only in the writer shown in FIG. 2 but also in other charged particle beam application system such as the CD-SEM.

Fifth Embodiment

In the first to fourth embodiments, the correction voltage is calculated by measuring the current value flowing in the earth pin. However, it is also possible to calculate the voltage given to the correction power supply by directly measuring the surface potential of a wafer by using a surface electrometer. However, since the response of the surface electrometer is slow, it is not suitable for the high-speed correction. Therefore, in the fifth embodiment, a method for realizing the practical electrostatic chuck using the surface electrometer will be described.

Figure 8A:
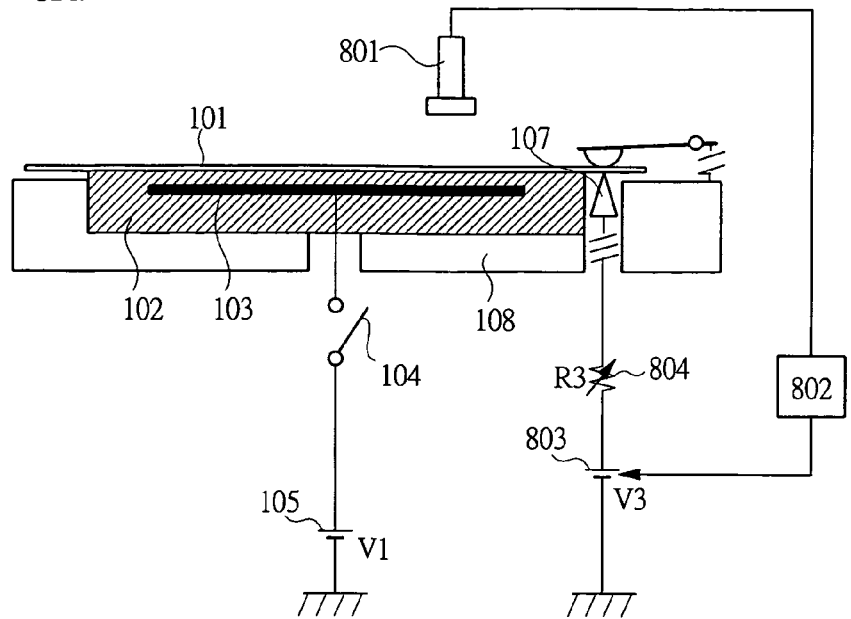
FIG. 8A is a schematic diagram showing the electrostatic chuck for describing the sixth embodiment of the present invention.

The electrostatic chuck according to the fifth embodiment will be described with reference to the schematic diagram of FIG. 8A. Similar to the first embodiment, the electrostatic chuck of this embodiment is mounted in the electron beam writer shown in FIG. 2. The direct current power supply 105 is connected to the chucking electrode 103 buried in the dielectric 102 via the switch 104, and the potential difference V1 is given between the ground potential and the chucking electrode 103. In the fifth embodiment, the earth pin 107 is pressed to the rear surface of the wafer 101. A power supply for correcting wafer potential 803 is connected to the earth pin 107, and the potential difference V3 is given between the ground potential and the wafer 101. The potential of the wafer 101 is monitored by the surface electrometer 801. A feedback circuit 802 adjusts the output of the power supply for correcting wafer potential 803 so that the measured value of the surface electrometer 801 falls within the allowable range. The reference numeral 804 denotes the variable resistance for adjusting the response speed of the wafer potential.

Figure 8B:
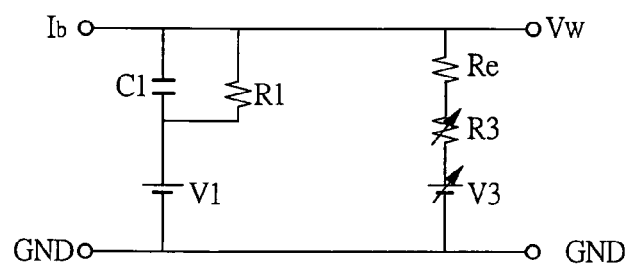
FIG. 8B is an equivalent circuit diagram.

Next, the function of the variable resistance 804 will be described with reference to FIG. 8B which is the electrical equivalent circuit of FIG. 8A. The reference symbol C1 denotes the electrostatic capacitance of the electrostatic chuck, R1 denotes the leakage resistance of the electrostatic chuck, and Re denotes the contact resistance between the earth pin 107 and the wafer 101. R3 denotes the variable resistance 804. Also, Ib denotes the beam current, Vw denotes the potential of the wafer 101, and GND denotes the ground potential.

In this circuit, when the values of Ib, V1 and V3 are changed, the response speed T of the wafer potential Vw is represented by the following expression.

$$T=R0\times C1$$

However, since R0 is the combined resistance of R1, Re and R3, it is defined by the following expression.

$$1/R0=1/R1+1/(Re+R3)$$

In this case, although it depends on the material and the shape of the electrostatic chuck, R1 is on the order of 10 to the 8th power $\Omega$ and C1 is on the order of 100 nF. On the other hand, Re is the contact resistance between the earth pin and the wafer and is on the order of 10 to the 4th power $\Omega$ though it is the parameter whose reproducibility is difficult to achieve. Therefore, when the variable resistance 804 is not provided, that is, when R3=0, the response speed T is on the order of 1 msec. Meanwhile, the response speed of the surface electrometer 801 is on the order of 100 msec though it depends on the measurement accuracy. More specifically, during the writing operation, the beam current is continuously changed at the frequency of several MHz or higher, and the wafer potential follows the change on the order of 1 msec. However, since the correction of the wafer potential is at most in the cycle of 100 msec, it is difficult to maintain the wafer potential at the desired value during the writing operation.

On the other hand, if an appropriate resistance value is selected for the R3, it is possible to adjust the response speed T of the wafer potential Vw. More specifically, if the resistance of about 10 to the 6th power $\Omega$ is selected for the R3, the response speed T of the wafer potential Vw is on the order of 100 msec, which is equal to the response speed of the surface electrometer 801. More specifically, since the change of the wafer potential becomes sufficiently slow, the measurement by the surface electrometer can catch up with it.

Figure 8C:
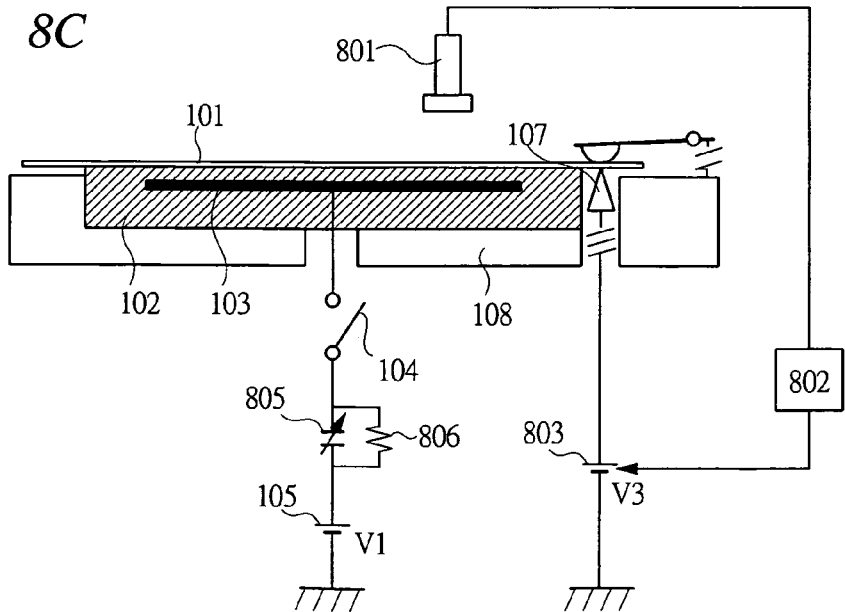
FIG. 8C is a schematic diagram showing the electrostatic chuck for describing the sixth embodiment of the present invention.

On the other hand, since the other parameter for adjusting the time constant of entire system is the electrostatic capacitance, for example, it is preferable to connect an appropriate variable capacitance 805 in series to the electrostatic chuck as shown in FIG. 8C. In order to obtain the potential difference between the chucking electrode and the wafer, it is necessary to provide a resistance 806 sufficiently lower than the internal resistance R1 of the chuck in parallel to the variable capacitance 805.

Note that, in this embodiment, the wafer potential is measured by the surface electrometer. However, even in the measurement of the wafer potential by using the ammeter in the first to third embodiments, the same method can be used. This is because the response speed of the ammeter is on the order of 1 μsec to 100 msec and it is slower than the response speed of the wafer potential in some cases. In such a case, similar to the fifth embodiment, an appropriate resistance value is selected as the variable resistance 804 to make the response speed of the wafer potential equal to that of the measuring device. By doing so, it is possible to maintain the wafer potential at the desired value during the writing operation.

In addition, although the power supply for correcting wafer potential 803 is used for the correction of the wafer potential, the same effect can be achieved also when a bipolar type electrostatic chuck is used and the wafer potential is adjusted by the voltage of one power supply for chucking. Also, although the variable resistance is used to adjust the response speed of the wafer potential in this embodiment, since the response speed of a measuring device is constant in many cases, the same effect can be achieved also when using the electric resistance fixed to the desired resistance value.

Different from the first to fourth embodiments, the wafer potential is directly measured by using a surface electrometer in the fifth embodiment. Therefore, the method of the fifth embodiment can be performed regardless of the contact resistance between the earth pin and the wafer. Also, one earth pin is enough in this embodiment. Furthermore, the electrostatic chuck according to the fifth embodiment can be mounted not only in the writer shown in FIG. 2 but also in other charged particle beam application system such as the CD-SEM.

Sixth Embodiment

In the second to fifth embodiments, the wafer potential is monitored by using an ammeter or a surface electrometer. On the other hand, in the sixth embodiment, the wafer potential is monitored through the observation of marks for correction formed on a wafer without using the electrical measurement.

The electrostatic chuck in the sixth embodiment will be described with reference to the schematic diagram of FIG. 9A. Also, in the following description, as the charged particle beam application system in which the electrostatic chuck of this embodiment is mounted, the electron beam writer shown in FIG. 2 is used. When the electron beam 901 emitted from a thermionic electron gun and accelerated and focused scans a surface of the wafer 101 by a deflector (not shown), backscattered electrons 902 are generated in accordance with the electron reflectivity of the marks for correction formed on the wafer. A backscattered electron detector 903 detects and multiplies the backscattered electrons 902 and then transmits them to a computer 904 as the backscattered electron signal. The computer 904 calculates the positions of backscattered electron images of the marks for correction based on the backscattered electron signal.

As shown in FIG. 4A, when the wafer is not kept at the ground potential, the equipotential lines which should be parallel to the wafer surface are distorted due to the difference in potential between the wafer and the pallet. Therefore, the electric field vector has the components vertical to the traveling direction of the beam. As a result, the trajectory of the electron beam is bent and it deviates from the ideal trajectory. If the marks for correction formed on the wafer are scanned in such a state, the observed backscattered electron image is displaced from the actual position. The amount of displacement depends on the irradiation position of the electron beam as shown in FIG. 4B.

In the sixth embodiment, the wafer potential is corrected based on the positions of backscattered electron images of a mark for correction formed on the central part of a wafer (hereinafter, referred to as mark A), a mark for correction formed on an edge part of the wafer (hereinafter, referred to as mark B). It is necessary to measure a length L1 between the mark A and the mark B with high accuracy in advance.

FIG. 10A is a flowchart of the operation of the writer during the wafer potential correction. The operation flow includes the steps as follows.

(1) Voltage is applied to the power supply for chucking 105 of the electrostatic chuck.

(2) The voltage of the power supply for correcting wafer potential 905 is set.

(3) The stage 211 is moved so that the electron beam is irradiated to the mark A.

(4) The backscattered electron image of the mark A is acquired to obtain the relative position of the mark to the beam center at this time (X1). This value is stored in a memory of the control circuit 213.

(5) The stage 211 is moved so that the electron beam is irradiated to the mark B. The amount of movement of the stage is set to L2, and the value thereof is stored in the memory of the control circuit 213.

(6) The backscattered electron image of the mark B is acquired to obtain the relative position of the mark B to the beam center at this time (X2). This value is stored in the memory of the control circuit 213.

(7) A length between the mark A and the mark B (L3) measured by the electron beam is calculated from the following expression.

$$L3=L2+(X2-X1)$$

(8) Difference between L3 and L1 (dL) is calculated.

(9) It is determined whether or not dL is within the allowable value.

(10) The writing operation is started if it is within the allowable value.

(11) The setting value of the power supply for correcting wafer potential 905 is changed if it is not within the allowable value.

Through the steps described above, the voltage of the power supply for correcting wafer potential 905 is adjusted so that the backscattered electron images are seen in their proper positions. By doing so, the wafer potential is corrected. Note that the steps (1) to (11) are all performed by the control circuit 213.

Different from the first to fifth embodiments, the sixth embodiment does not require a special measuring device such as an ammeter or a surface electrometer. The marks for correction and a detector have been conventionally used in the electron beam writer. Therefore, the method can be realized without changing the configuration of the conventional electron beam writer.

Note that, in this embodiment, the voltage value of the power supply for correcting wafer potential 905 is changed until the backscattered electron image is seen in its proper position. However, if the relation between the displacement amount and the wafer potential is obtained in advance to set the proper voltage of the power supply for correcting wafer potential, the number of repetitions can be reduced.

Alternatively, instead of using the mark for correction formed on a wafer, a mark for calibration 906 is formed on a part of the pallet near the wafer as shown in FIG. 9B, and the mark for calibration is observed. By doing so, the same effect can be achieved. In this case, since it is not necessary to chuck the wafer when the backscattered electron image of the mark for calibration 906 is being obtained, the wafer potential can be corrected through the steps (1) to (9) described below. FIG. 10B is a flowchart of the steps.

(1) Voltage of the power supply for correcting wafer potential 905 is set.

(2) The sufficiently low voltage is set to the power supply for chucking.

(3) The backscattered electron image of the mark for calibration is acquired to obtain the relative position of the mark for calibration to the beam center at this time (X1). This value is stored in a memory of the control circuit 213.

(4) The voltage required for the writing operation is set to the power supply for chucking.

(5) The backscattered electron image of the mark for calibration is acquired to obtain the relative position of the mark for calibration to the beam center at this time (X2). This value is stored in a memory of the control circuit 213.

(6) Difference between X1 and X2 (dX) is calculated.

(7) It is determined whether or not dX is within the allowable value.

(8) The writing operation is started if it is within the allowable value.

(9) The setting value of the power supply for correcting wafer potential 905 is changed if it is not within the allowable value.

Since this method can be performed during the writing operation, the readjustment of the power supply for correcting wafer potential 905 can be performed even in the case where there is a high possibility that the wafer potential is largely changed, for example, in the case where the beam current is largely changed during the writing operation. Also, the electrostatic chuck according to the sixth embodiment can be mounted not only in the writer shown in FIG. 2 but also in other charged particle beam application system such as the CD-SEM.

Seventh Embodiment

In this embodiment, the electrostatic chuck is applied to the CD-SEM. The electrostatic chuck shown in FIG. 5A is provided in the CD-SEM. In the CD-SEM, the current of the electron beam is about 10 pA which is lower than that in the writer. Therefore, even if the contact resistance of the earth pin 107 is relatively high, the influence on the measurement is small. However, if the leakage current to the earth pin of the electrostatic chuck is high, it is impossible to utilize this merit. In this seventh embodiment, the bipolar type electrostatic chucks 501 and 502 and an ammeter 506 connected to the earth pin 107 are used. By adjusting the voltages 503 and 504 of the chuck so that the current becomes lower than the predetermined value, the leakage current to the earth pin can be reduced. Consequently, it is possible to reduce the contact resistance dependency of the earth pin, and as a result, it becomes possible to reduce the pressing force of the earth pin to the wafer 101. This is a great advantage for preventing a side effect such as the generation of dusts.

The ammeter 506 has a sufficient accuracy, and the leakage current to the earth pin is reduced by this electrostatic chuck to 10 pA or lower, which is one millionth of the chucking current of the chuck of 10 μA. Also, the surface potential becomes 0.1 V or lower, and the variation in measurement in the wafers is reduced to 1 nm or smaller.

In addition, according to this embodiment, the wafer potential can be set not only to the ground potential but also to the arbitrary potential. In the inspection apparatus using the potential contrast or the like, by charging the wafer to a desired potential, the high-speed and highly accurate inspection can be realized.

What is claimed is:

1. A charged particle beam application system, comprising: a sample stage for holding a sample; means for irradiating charged particle beam to the sample on the sample stage; and an electrostatic chuck mounted on said sample stage,
    wherein the electrostatic chuck comprises:
    a dielectric having a mounting surface on which the sample is mounted;
    electrodes provided in the dielectric;
    a contact terminal for setting said sample to ground potential;
    a variable direct current power supply and a direct current power supply electrically connected to said electrodes;
    control means for controlling a voltage applied to the variable direct current power supply; and
    current measuring means arranged between said contact terminal and said ground potential, and
    said control means calculates said voltage applied to the variable direct current power supply based on the measurement result of the current measuring means.

2. The charged particle beam application system according to claim 1,
    wherein a plurality of said electrodes are provided,
    said variable direct current power supply and direct current power supply are connected to either of said plurality of electrodes, and
    said plurality of electrodes, the variable direct current power supply and the direct current power supply form a closed circuit.

3. The charged particle beam application system according to claim 1,
    wherein a plurality of said electrodes are provided,
    said variable direct current power supply and direct current power supply are connected between the plurality of electrodes and the ground potential, and
    a feedback circuit arranged between the current measuring means and said variable direct current power supply is provided as said control means.

4. The charged particle beam application system according to claim 1,
    wherein a plurality of said electrodes are provided,
    a plurality of direct current power supplies corresponding to the number of the plurality of electrodes are provided, and
    said variable direct current power supply is arranged between said current measuring means and said ground potential or between said contact terminal and said current measuring means.

5. The charged particle beam application system according to claim 1,
wherein a plurality of said electrodes are provided,
said direct current power supply is arranged between said electrode and said ground potential, and
said variable direct current power supply is arranged between said current measuring means and said ground potential or between said contact terminal and said current measuring means.

6. The charged particle beam application system according to claim 5,
wherein a plurality of said electrodes and a plurality of said current measuring means are provided.

7. The charged particle beam application system according to claim 4,
wherein three or more contact terminals are provided.

8. A charged particle beam application system, comprising: a sample stage for holding a sample; means for irradiating charged particle beam to the sample on the sample stage; and an electrostatic chuck mounted on said sample stage,
wherein the electrostatic chuck comprises:
a dielectric having a mounting surface on which the sample is mounted;
electrodes provided in the dielectric;
a contact terminal for setting said sample to ground potential;
a variable direct current power supply and a direct current power supply electrically connected to said electrodes;
control means for controlling a voltage applied to the variable direct current power supply;
potential measuring means for measuring the potential of said sample; and
adjusting means for adjusting response speed of the sample potential, and
said control means calculates said voltage applied to the variable direct current power supply based on the measurement result of the potential measuring means.

9. The charged particle beam application system according to claim 8,
wherein said adjusting means is electric resistance provided on a path between said contact terminal and said ground potential.

10. The charged particle beam application system according to claim 9,
wherein said adjusting means is a RC circuit arranged between said electrode and said ground potential.

11. The charged particle beam application system according to claim 10,
wherein a resistor and a capacitor of said RC circuit are arranged in parallel to said variable direct current power supply and said electrode.

12. A charged particle beam application system, comprising:
a charged particle gun;
a lens for focusing charged particles emitted from said charged particle gun on a sample;
a stage which can be moved during a process for the sample; and
an electrostatic chuck having a sample holding member made of a dielectric on said stage, a ground electrode in contact with the sample mounted on said holding member, and a chucking electrode which faces to said ground electrode with interposing said dielectric therebetween, said electrostatic chuck being for generating electrostatic force between said ground electrode and said chucking electrode to chuck said sample to said holding member by this electrostatic force,
wherein a mark for calibration adjacent to said sample, means for detecting a relative position of the irradiated charged particle beam to said sample or said mark for calibration, and a direct current power supply for adjusting potential of said sample between said ground electrode and the ground potential are provided.

* * * * *